(12) United States Patent
Chisholm et al.

(10) Patent No.: US 9,108,322 B2
(45) Date of Patent: Aug. 18, 2015

(54) FORCE SENSING SYSTEM FOR SUBSTRATE LIFTING APPARATUS

(71) Applicant: Varian Semiconductor Equipment Associates, Inc., Gloucester, MA (US)

(72) Inventors: Richard V. Chisholm, Swampscott, MA (US); Scott E. Peitzsch, Tewksbury, MA (US); Michael Esposito, Andover, MA (US); Robert A. Poitras, Beverly, MA (US); Steven M. Anella, West Newbury, MA (US); Daniel A. Hall, West Newbury, MA (US); Scott C. Holden, Melrose, MA (US); Roger B. Fish, Bedford, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 72 days.

(21) Appl. No.: 13/918,128

(22) Filed: Jun. 14, 2013

(65) Prior Publication Data
US 2014/0324221 A1    Oct. 30, 2014

Related U.S. Application Data

(60) Provisional application No. 61/817,194, filed on Apr. 29, 2013.

(51) Int. Cl.
*G06F 7/00* (2006.01)
*B25J 13/08* (2006.01)
*H01L 21/67* (2006.01)
*H01L 21/687* (2006.01)

(52) U.S. Cl.
CPC ......... *B25J 13/085* (2013.01); *H01L 21/67288* (2013.01); *H01L 21/68742* (2013.01); *Y10S 901/02* (2013.01)

(58) Field of Classification Search
CPC ............ H01L 21/681; H01L 21/67259; H01L 21/67276
USPC .......................................................... 700/218
See application file for complete search history.

(56) References Cited

U.S. PATENT DOCUMENTS

| | | | |
|---|---|---|---|
| 2003/0205329 A1* | 11/2003 | Gujer et al. | 156/345.51 |
| 2004/0031338 A1 | 2/2004 | Chen et al. | |
| 2006/0178009 A1 | 8/2006 | Tanaka | |
| 2006/0238953 A1 | 10/2006 | Hanawa et al. | |
| 2007/0152690 A1 | 7/2007 | Sung | |
| 2008/0285203 A1* | 11/2008 | Weijiang et al. | 361/234 |
| 2010/0013626 A1* | 1/2010 | Park et al. | 340/521 |
| 2011/0130865 A1* | 6/2011 | Setzer et al. | 700/213 |

OTHER PUBLICATIONS

International Search Report and Written Opinion mailed Aug. 26, 2014 for PCT Application PCT/US2014/034365 Filed Apr. 16, 2014.

* cited by examiner

*Primary Examiner* — Gene Crawford
*Assistant Examiner* — Kyle Logan (57) ABSTRACT

A system and method for monitoring forces on a substrate lifting apparatus. The system includes a platen cartridge with a platen and a movable lifting portion. The movable lifting portion includes a plurality of lifting arms coupled to a plurality of lift pins. A plurality of force sensing elements are associated with respective ones of the plurality of lifting arms and the plurality of lift pins. A controller receives signals from the plurality of force sensing elements, correlates the signals to respective forces applied to said plurality of lift pins. The correlated forces may indicate to the controller that an error condition exists, such as a stuck wafer, a broken wafer, a mis-positioned wafer, or a mechanical malfunction.

20 Claims, 8 Drawing Sheets

FORCE SENSING SYSTEM FOR SUBSTRATE LIFTING APPARATUS

CROSS-REFERENCE TO RELATED APPLICATIONS

This is a non-provisional of pending U.S. provisional patent application Ser. No. 61/817,194, filed Apr. 29, 2013, the entirety of which provisional application is incorporated by reference herein.

FIELD OF THE DISCLOSURE

The disclosure relates generally to semiconductor processing systems, and more particularly to a system for monitoring forces applied to a substrate lifting apparatus used in substrate transfer operations.

BACKGROUND OF THE DISCLOSURE

During production, substrates are often handled by robotic arms that are equipped with specialized tools, or "end effectors," that are adapted for lifting and moving the substrates between a substrate cassette or other container and a processing platen located within a process chamber. End effectors typically engage the substrates from below. As such, while an end effector can pick a substrate directly from a cassette, it typically cannot directly deposit a substrate onto the surface of the platen.

Thus, the platen often includes a set of movable pins that protrude upward through openings in the top surface of the platen. The end effector positions the substrate above the pins, the pins move upward to pick up the substrate and raise it above the end effector. Once the pins raise the substrate out of engagement with the end effector, there is sufficient distance between the substrate and the platen top surface to allow the end effector to retract from the platen. The pins can then be retracted through the openings, lowering the substrate onto the platen.

An electrostatic chuck can then be used to secure the substrate to the platen so that one or more processing steps can be performed. When processing is complete, the electrostatic chuck can release the substrate, the pins are moved upward to protrude through the openings and lift the substrate above the platen so the end effector can engage and remove the substrate from the process chamber.

As will be appreciated, problems such as substrate breakage, substrate mis-positioning, substrate sticking, and the like, can occur before, during or after the substrate transfer and/or processing operations. It would be desirable, therefore, to provide a system capable of detecting such problems so that corrective action can be taken in an efficient and cost effective manner.

SUMMARY OF THE DISCLOSURE

A system is disclosed for monitoring force on a substrate lifting apparatus. The system includes a platen cartridge having a platen and a movable lifting portion. The movable lifting portion can include a plurality of lifting arms coupled to a plurality of lift pins. A plurality of force sensing elements may be associated with respective ones of the plurality of lifting arms and the plurality of lift pins. The system may further include a controller for receiving signals from the plurality of force sensing elements, and for correlating said received signals to respective forces applied to the plurality of lift pins.

A method is disclosed for sensing forces applied to a substrate lifting apparatus. The method can include receiving, at a controller, signals from at least one force sensing element, where the received signals are representative of a force applied to a lift pin of a substrate lifting apparatus, and controlling operation of said substrate lifting apparatus based on said received signals.

A method is disclosed for operating a substrate lifting apparatus. The method can include, at a controller, sampling signals from at least one force sensing element associated with a lift pin of a substrate lifting apparatus, where the sampling occurs prior to moving the lift pin, and where the sampled signals are representative of force applied to said lift pin. The method can further include controlling movement of said lift pin based on said sampled signals.

DETAILED DESCRIPTION

An improved lift pin arrangement will now be described more fully hereinafter with reference to the accompanying drawings, in which preferred embodiments of the invention are shown. It will be appreciated that the disclosed lift pin arrangement may be embodied in many different forms and should not be construed as being limited to the embodiments set forth herein. Rather, these embodiments are provided so that this disclosure will be thorough and complete, and will fully convey the scope of the invention to those skilled in the art. In the drawings, like numbers refer to like elements throughout.

Figure 1:
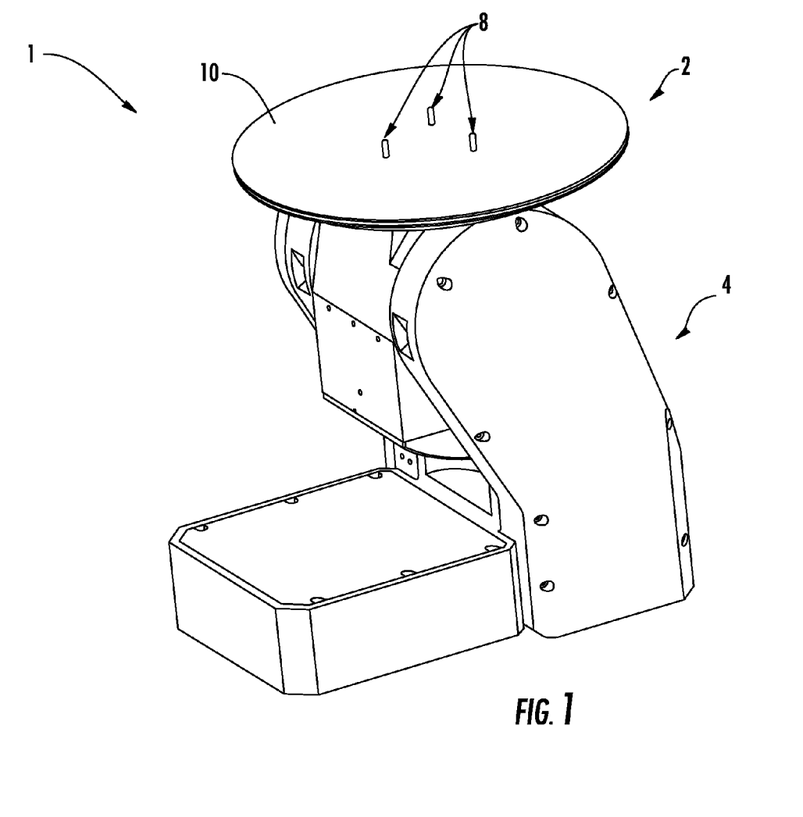
FIG. 1 is an isometric view of an exemplary rotating substrate platen arrangement incorporating the disclosed system.

FIG. 1 illustrates an exemplary embodiment of a system in accordance with the present disclosure. For the sake of convenience and clarity, terms such as "front," "rear," "top," "bottom," "right," "left," "up," "down," "inwardly," "outwardly," "lateral" and "longitudinal" will be used herein to describe the relative placement and orientation of components of the system, each with respect to the geometry and orientation of the as it appears in FIG. 1. Said terminology will include the words specifically mentioned, derivatives thereof, and words of similar import.

In some substrate processing applications, ion beam implanters utilize a rotating platen device 1, a non-limiting exemplary illustration of which is shown in FIG. 1. The rotating platen device 1 may be disposed within a process chamber (not shown) and may be configured to hold a substrate in a desired position during one or more implanting steps. The rotating platen device 1 may include a platen 2 and a base portion 4, which can be controllably rotatable with respect to each other so that during processing the substrate can be held at a desired angle with respect to an incident ion beam.

As can be seen in FIG. 1, a plurality of lift pins 8 may be axially movable so as to protrude above a top surface 10 of the platen 2. In the illustrated embodiment, three lift pins 8 are provided in a triangular arrangement. It will be appreciated, however, that this is not critical and that different numbers of pins, in different arrangements, may be used as desired.

Figure 2:
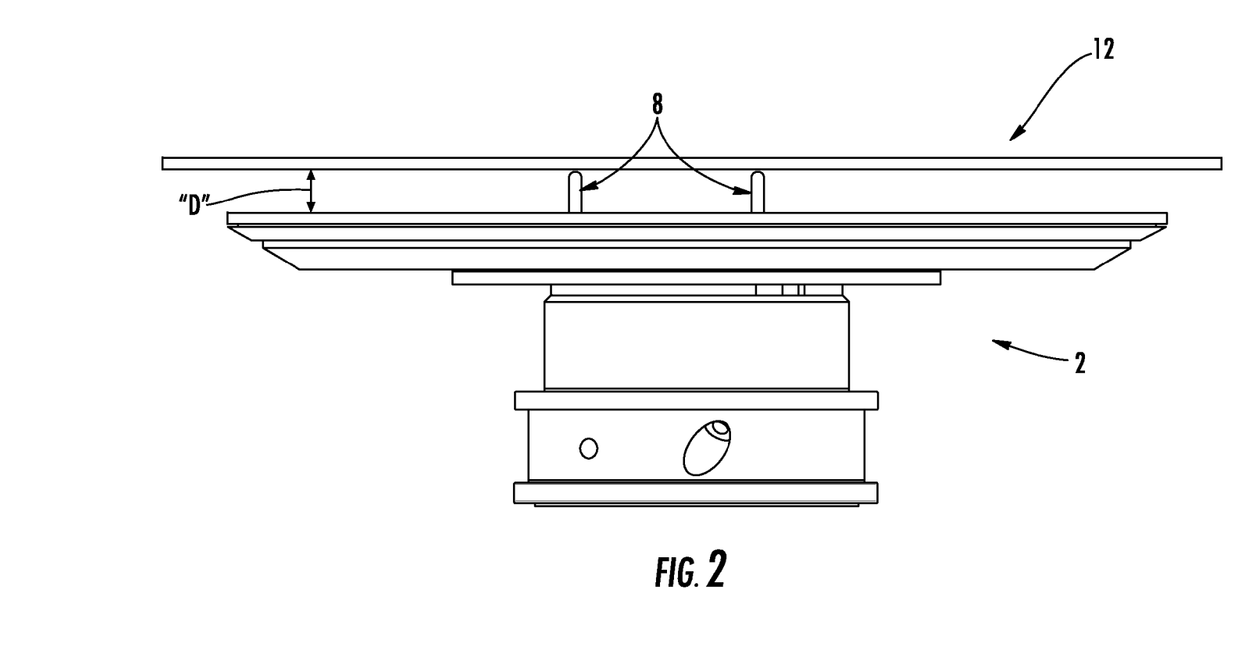
FIG. 2 is a side view of a platen portion of the rotating substrate platen arrangement of FIG. 1 showing the lift pins in the extended position.

FIG. 2 shows a side view of the platen 2 in which an exemplary substrate 12 is held a distance "D" above the top surface 10 by the lift pins 8. The pins 8 are shown in the extended position. For clarity the base portion 4 is not shown in this and further views. The distance "D" can be selected to be larger than the vertical dimension of an associated end effector. Thus, when the lift pins 8 are in the extended position, the end effector can be inserted between the substrate 12 and the top surface 10 of the platen 2 to either engage or disengage the substrate.

Figure 3:
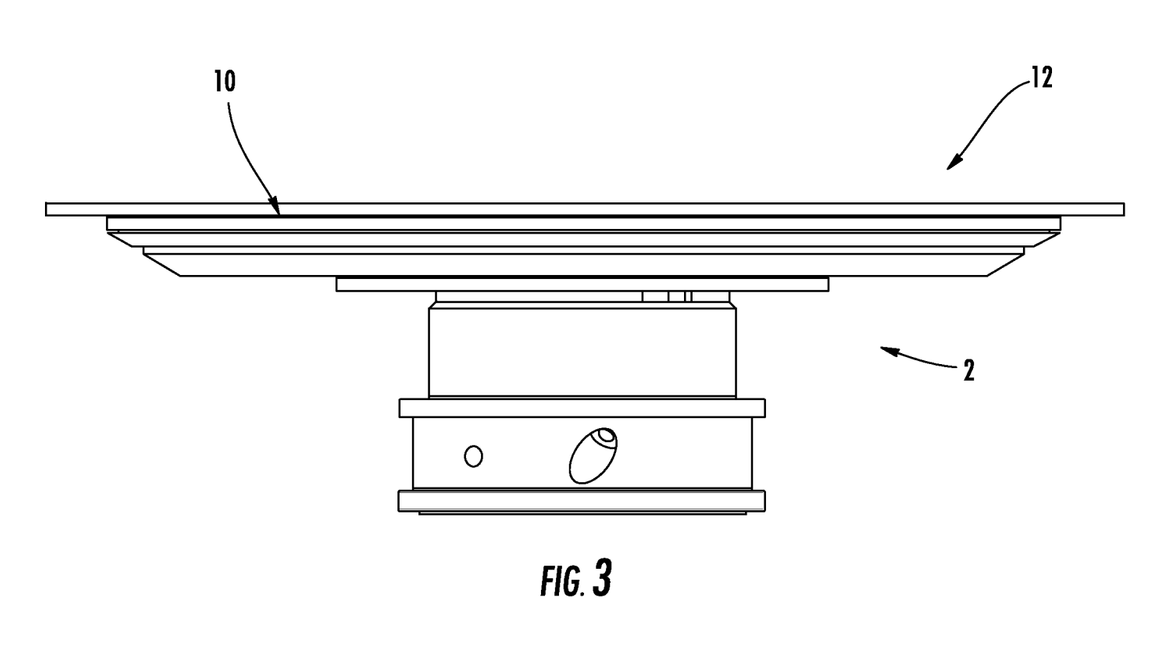
FIG. 3 is side view of the platen portion of FIG. 2 showing lift pins in the retracted position.

The position of the lift pins 8 can be controlled so that once they have engaged the substrate 12, they can be retracted into the platen 2 to bring the substrate down into contact with the top surface 10 of the platen. The retracted position of the pins 8 is shown in FIG. 3. The substrate 12 can then be secured to the platen 2 using an electrostatic clamp (not shown) or other appropriate technique, thus permitting the substrate to be tilted and/or rotated to a desired orientation for undergoing one or more implant processes.

Once processing is completed, the platen 2 may be rotated so that the substrate 12 is returned to a horizontal orientation. The electrostatic clamp can then be de-energized, and the lift pins 8 can again be moved to their extended position to raise the substrate 12 above the top surface 10 of the platen 2 (FIG. 2), thus permitting the end effector to extend beneath the substrate. The lift pins 8 may once again be retracted toward the platen 2, lowering the substrate 12 back onto the end effector so that it may transport the substrate back out of the process chamber.

As previously mentioned, during substrate handling and processing operations a variety of error conditions can be experienced, including the presence of broken or mis-positioned substrates on the platen, substrates that stick to the platen after the electrostatic clamp is de-energized, malfunctioning lift pins, and the like. The disclosed lifting arrangement, therefore, includes a force sensing feature associated with one or more of the lift pins 8 to assure that substrate 12 transfers onto and off the platen 2 are completed in a safe and efficient manner, and to allow corrective action to be taken if an error condition is sensed.

Figure 4:
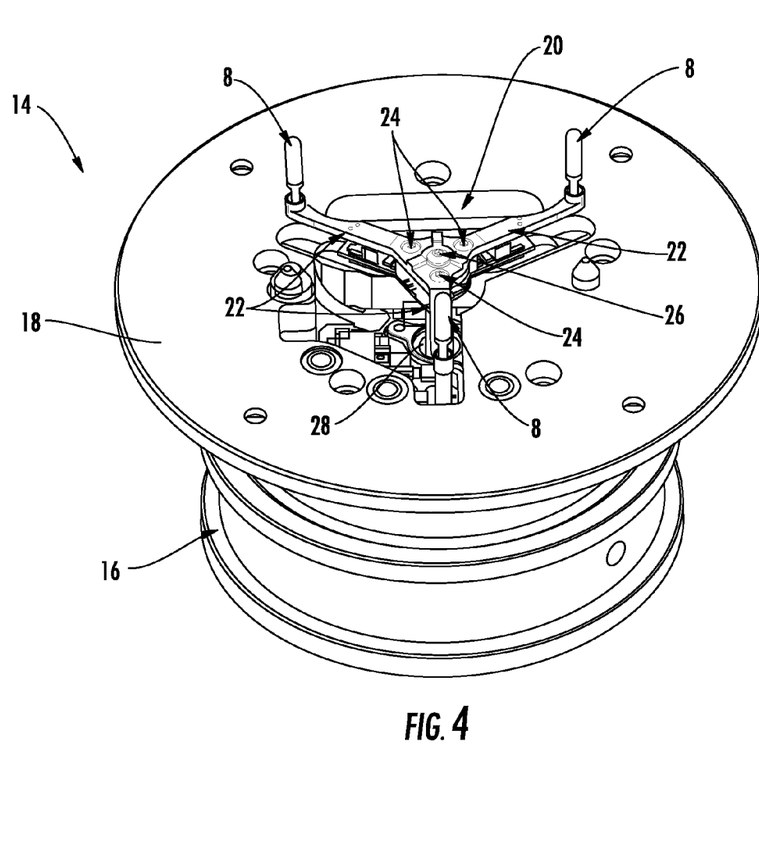
FIG. 4 is an isometric view of a lift pin portion of the disclosed system, the lift pin portion configured in a recessed position.

Referring to FIG. 4, a platen cartridge 14 can include a cartridge base 16, a platen support 18 and a movable lifting portion 20 configured to raise and lower the lift pins 8 with respect to the platen cartridge. The movable lifting portion 20 includes a plurality of lifting arms 22, each of which is associated with a respective lift pin 8. The lifting arms 22 are coupled at proximal ends 24 to a central hub 26 which, in turn, is coupled to a central lifting post 28. Thus arranged, by extending and retracting the central lifting post 28 in and out of the platen cartridge 14, the lift pins 8 can be selectively configured in the extended and retracted position shown in FIGS. 2 and 3. FIG. 4 shows the movable lifting portion 20 in the retracted position associated with the pin placement of FIG. 2, while FIG. 5 shows the movable lifting portion 20 in the extended position associated with the pin placement of FIG. 3.

Figure 5:
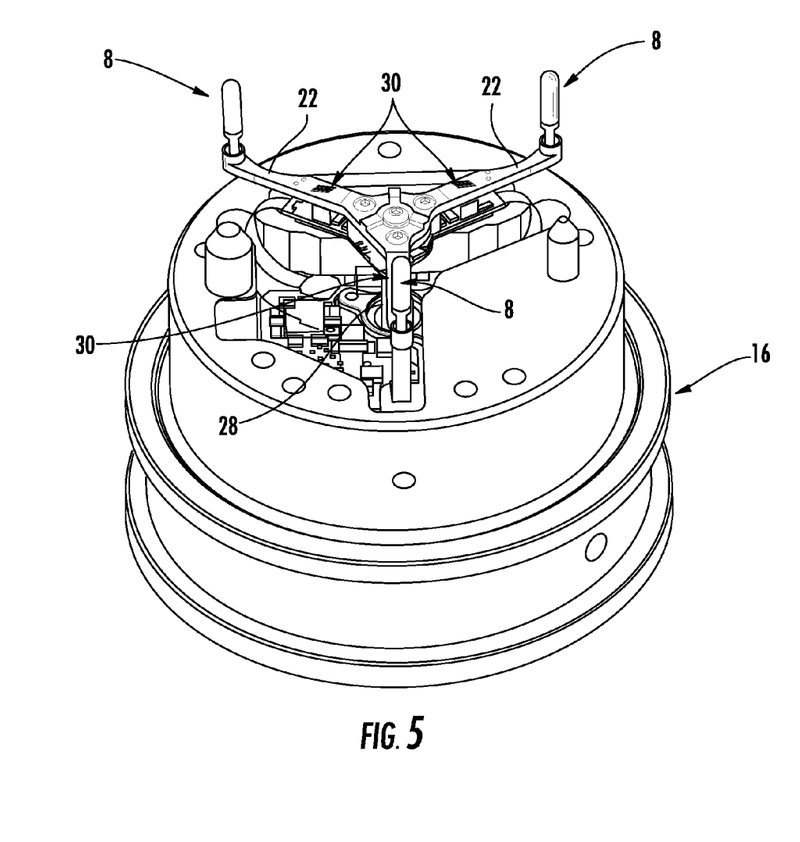
FIG. 5 is an isometric view of the lift pin portion of FIG. 4, the lift pin portion configured in an extended position.

FIG. 5 shows the platen cartridge 14 with the platen support 18 removed. As will be appreciated, selective movement of the central lifting post 28 (i.e., rotation, axial extension/retraction) may be achieved using any of a variety of appropriate actuating mechanisms disposed on the platen cartridge 14, including servo motors and the like.

FIG. 5 further shows a plurality of sensing elements 30 associated with each of the lifting arms 22. Only two of the three sensing elements 20 are visible in FIG. 5, the third being obscured by the presence of one of the lift pins 8. As will be described in greater detail, these sensing elements 30 can be used to detect forces applied to the lifting arms 22 via the lift pins 8. It will be appreciated that the sensing elements 30 may be disposed on the lift pins 8, or that more than one sensing element may be provided for each lift pin and/or lifting arm 22. The sensing elements 30 may be used to sense and recognize the weight of a substrate 12 supported by the lift pins 8, as well as to sense and recognize any unexpected forces applied to any of the lift pins which may be indicative of a system malfunction or error condition. For example, the sensing elements 30 may be used to detect whether the substrate 12 is positioned correctly on the platen 2 by comparing measurements between the three sensing elements, as will be described in greater detail later.

Figure 6:
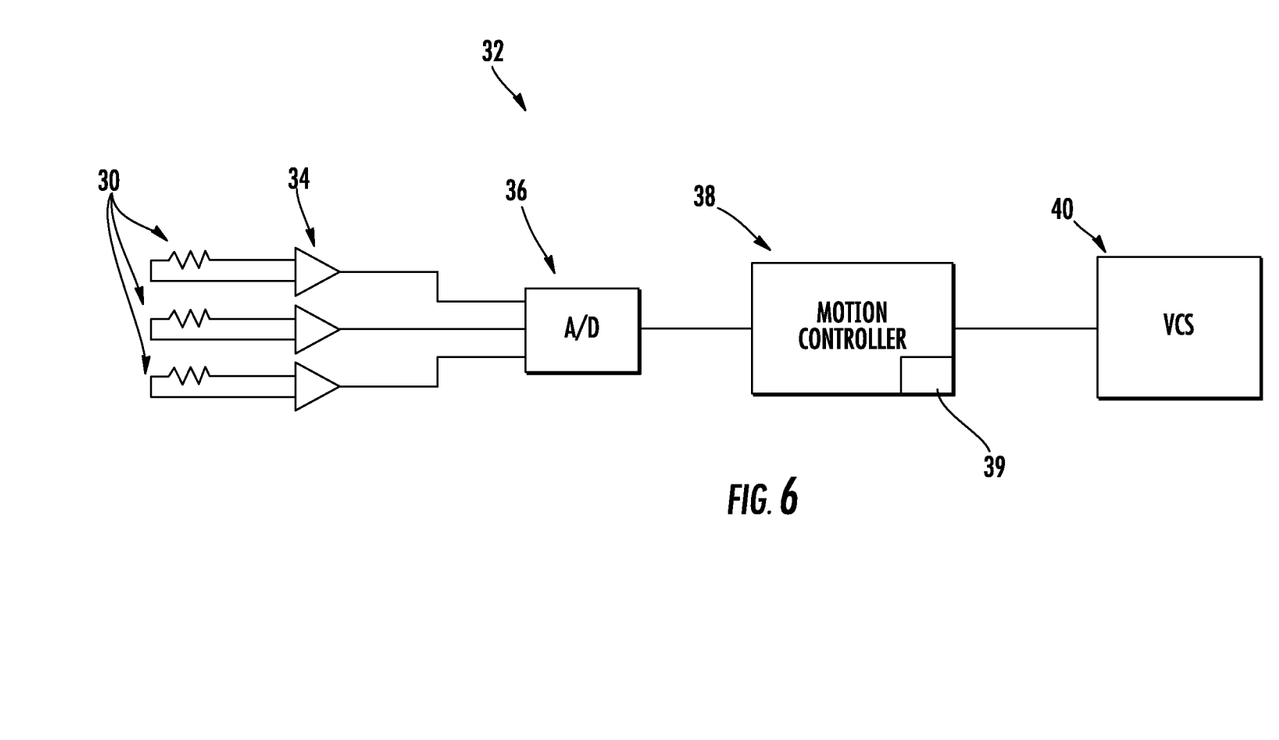
FIG. 6 is a schematic of a sensor electronics and control system interface portion of the disclosed system.

In one embodiment, the sensing elements 30 may comprise strain gauges, such as wire mesh strain gauges, piezoelectric strain gauges, semiconductor strain gauges and the like. In other embodiments the sensing elements 30 may be force sensitive resistors, optical displacement sensors, and the like. An associated sensor electronics and control system interface 32 is shown in FIG. 6. The sensor electronics and control system interface 32 may condition signals received from the sensing elements 30 so that they can be correlated to representative force values for each of the lift pins 8.

In the illustrated embodiment, the sensing elements 30 are coupled to appropriate amplification circuitry 34, which in one embodiment includes op-amps. The amplified signals may then be processed by an analog to digital (AD) converter 36, and sent to a controller 38. In the illustrated embodiment, the controller 38 is a programmable multi-axis controller (PMAC) capable of high speed sampling of the sensing elements 30 and of controlling the movable lifting portion 20. The controller 38 may be configured to compare signal samples from the sensing elements 30 with one or more predetermined values and/or predetermined ranges to determine if an out of range condition exists for any or all of the sensing elements 30. In one embodiment the controller 38 may have memory 39 connected thereto for storing a variety of predetermined values associated with the sensing elements 30. In other embodiments the memory 39 may store operational history relating to the sensors 30 and the movable lifting portion 20.

The controller 38 may be configured to stop, or to signal stoppage, of a substrate transfer operation if an error condition is observed. In one embodiment, an error condition is a condition in which a signal representative of a force value near to, or outside of, a predetermined value or range, is obtained from at least one of the sensing elements 30.

The motion controller 38 may stop movement of the robot arm/end effector if it senses an error condition. This can prevent undesired contact between the end effector and the substrate 12 when the substrate is determined, for example, to be mis-positioned. The motion controller 38 may interface with an implanter control computer 40, which can provide supervisory functions and an operator interface. In some instances, the motion controller 38 can signal the implanter control computer 40 if any error conditions, or any other issues, are detected with the lift mechanism, in order to coordinate with other implanter subsystems.

The sensor elements 30 may be sampled any of a variety of points before, during and/or after substrate transfer operations occur. Examples of such samplings are described below.

Unloaded Force in Range—Prior to performing an implant, all sensing elements 30 should detect force below a lower threshold value. Force detected above the threshold value may indicate a mechanical failure or an instrumentation problem.

Substrate on Lift Pins—When the substrate 12 is placed onto, or taken off, the platen 2, the lift pins 8 are raised to unload/load end effector. Once the lift pins 8 are in the extended position, all sensing elements 30 should detect force within a predetermined range on each lift pin.

Substrate Broken—When lift pins 8 are configured in the extended position, all sensing elements 30 should detect force above a threshold value. A lower than threshold value may indicate a substrate breakage condition.

Substrate Off Center—Once the lift pins 8 are configured in the extended position, the sensing elements 30 should detect force on the lift pins 8 that is the same, within a predetermined threshold value. A higher than threshold difference may indicate the substrate is off center with respect to the lift pins 8 and the platen 2.

Foreign Object on Substrate—Once the lift pins 8 are configured in the extended position, the sensing elements 30 should detect force on each lift pin 8 below a predetermined threshold. A higher than threshold value may indicate that a foreign object is on the substrate 12.

Equal Forces on Arms—When placing the substrate 12 onto the lift pins 8, force should be monitored for all lift pins 8. If force on any single lift pin 8 is determined to exceed a predetermined threshold value, further lifting can be stopped. A higher than threshold value may indicate a mechanical failure.

Substrate Sticking—After de-energizing the electrostatic clamp, force on the lift pins 8 can be monitored while moving the lifting pins from the retracted position to the extended position. If the force sensed for any single lifting arm 22 exceeds a predetermined threshold value, further lifting can be stopped. A higher than threshold force on one lift pin 8 and a lower than threshold force on one or both of the remaining lift pins 8 can indicate that the substrate 12 is sticking to the platen 2.

Figure 7:
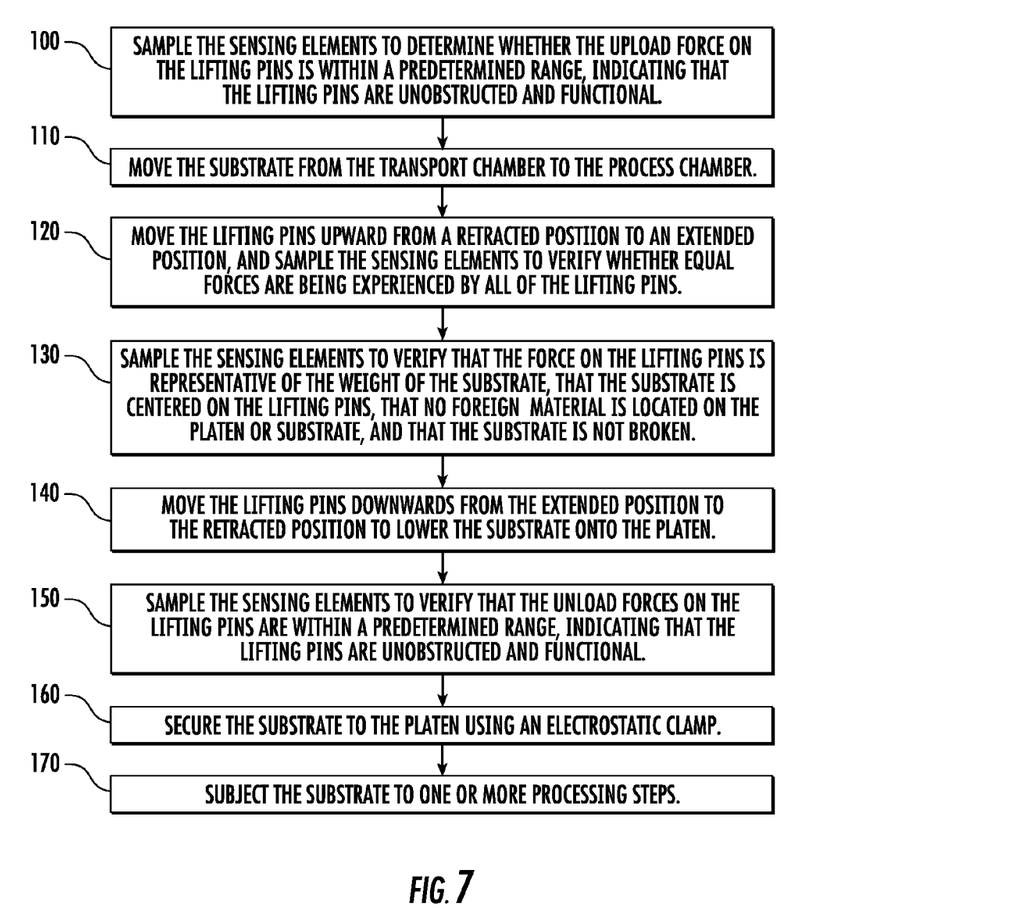
FIG. 7 is a logic flow diagram illustrating a method for operating the disclosed system.

FIG. 7 is a flow diagram illustrating a method for operating the disclosed system prior to performing one or more implant processes on the substrate 12. At step 100, the substrate 12 is positioned in a transport chamber. At this point the substrate is supported by an end effector and the lift pins 8 are in the retracted position. The controller 38 may sample the sensing elements 30 to determine whether the upload force on the lift pins 8 is within a predetermined range. The predetermined range may be a force range that indicates the lift pins 8 are unobstructed and functional.

At step 110, the substrate 12 is moved from the transport chamber to the process chamber by the end effector. The lift pins 8 remain in the retracted position. At step 120, the substrate 12 is positioned in the process chamber, and is supported by the end effector. The lift pins 8 are moving upward from the retracted position to the extended position to engage the substrate 12, while the controller 38 samples the sensing elements 30 to verify whether equal forces are being experienced by all of the lift pins 8. At step 130, the substrate 12 is supported by the lift pins 8, and the end effector is retracted back to the transport chamber. The lift pins 8 are in the extended position. The controller 38 may sample the sensing elements 30 to verify that the force on the lift pins 8 is representative of the weight of the substrate 12, that the substrate 12 is centered on the lift pins 8, that no foreign material is located on the platen or substrate 12, and/or that the substrate is not broken.

At step 140, the substrate 12 is still supported by the lift pins 8 in the process chamber, the end effector remains in the transport chamber, and the lift pins are moving downward from the extended position to the retracted position so as to engage the substrate 12 with the platen 2. At step 150, the substrate 12 is supported by the platen 2 and the lift pins 8 are in the retracted position. The controller 38 may sample the sensing elements 30 to verify that the unload forces on the lift pins 8 are within a predetermined range. The predetermined range may be a force range that indicates the lift pins are unobstructed and functional. At step 160, the substrate 12 is secured to the platen 2 by an electrostatic clamp. At step 170 the substrate 12 is moved by the rotating platen device 1 into a position appropriate for undergoing one or more processing steps, such as an ion implant process.

Figure 8:
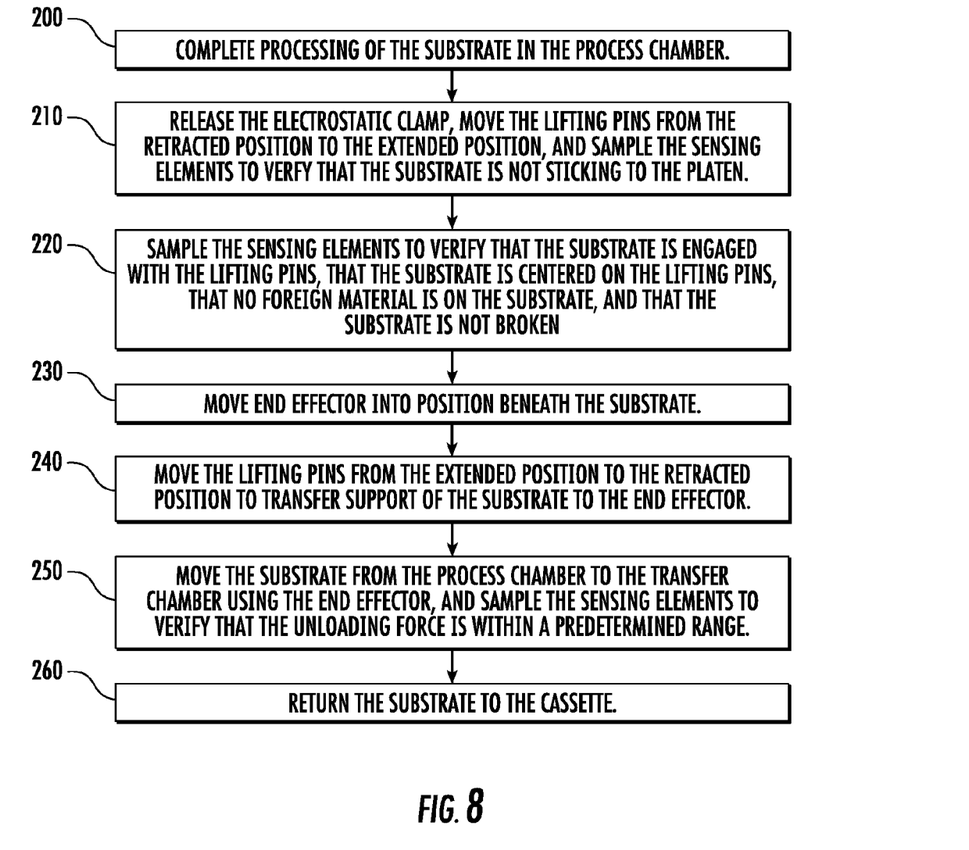
FIG. 8 is a logic flow diagram illustrating a further method for operating the disclosed system.

FIG. 8 is a flow diagram illustrating exemplary system validations that can be performed after to the substrate 12 has undergone one or more implant processes. At step 200, the substrate 12 is positioned within the process chamber, and is secured to the platen 2 by the electrostatic clamp. The lift pins 8 are in the retracted position. At step 210, the electrostatic clamp is released, and the lift pins 8 are moving from the retracted position to the extended position. The controller 38 samples the sensing elements 30 to verify that the substrate 12 is not sticking to the platen 2. At step 220, the substrate 12 is supported by the lift pins 8. The controller 38 may sample the sensing elements 30 to verify that the substrate 12 is engaged with the lift pins 8, that the substrate is centered on the lift pins 8, that no foreign material is on the substrate, and that the substrate is not broken.

At step 230, the substrate 12 remains supported by the lift pins 8, and the end effector is moved into position beneath the substrate 12. The lift pins 8 are in the extended position. At step 240, the substrate 12 is in the processing chamber, and the lift pins 8 are moving from the extended position to the retracted position to transfer support of the substrate 12 to the end effector. At step 250, the substrate is supported by the end effector, and the end effector is moving the substrate 12 to the transport chamber. The lift pins 8 are in the retracted position. The controller 38 may sample the sensing elements 30 to verify that the unloading force is within a predetermined range. At step 260 the substrate is returned to the cassette.

The disclosed system adds security and information regarding the substrate's condition and position. In addition the disclosed system can be used to monitoring the condition of the platen, enabling a user to determine, for example, whether foreign material (e.g., broken substrate pieces) reside on the platen, or whether a problem exists with the movable lifting portion 20 and/or any of its components.

The disclosed system is configured for handling a variety of substrates, which in an exemplary embodiment includes silicon wafers. It will be appreciated by those of ordinary skill in the art that this particular configuration is disclosed by way of example only, and that the below-described arrangement may be similarly implemented in virtually any type of substrate handling configuration. All such embodiments are contemplated and may be implemented without departing from the scope of the present disclosure.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

The invention claimed is:

1. A system for monitoring force on a substrate lifting apparatus, comprising:
   a platen cartridge including a platen and a movable lifting portion, the movable lifting portion comprising a plurality of lifting arms coupled to a plurality of lift pins, the plurality of lifting arms coupled at respective proximal ends to a central hub;
   a plurality of force sensing elements associated with respective ones of said plurality of lifting arms and said plurality of lift pins, wherein each of the plurality of force sensing elements is disposed on a respective one of the plurality of lifting arms; and
   a controller for receiving signals from the plurality of force sensing elements, and for correlating said received signals to respective forces applied to said plurality of lift pins.

2. The system of claim 1, the controller configured to control movement of the movable lifting portion based on said correlated forces.

3. The system of claim 1, wherein the movable lifting portion is configured to move the plurality of lift pins between a retracted position in which the pins are below a top surface of the platen, and an extended position in which the pins extend above the top surface of the platen.

4. The system of claim 1, wherein the controller is configured to distinguish between forces applied to each of said plurality of lift pins, and to control movement of the movable lifting portion based on said distinguished forces.

5. The system of claim 1, the controller comprising a memory for storing an operational history of the respective forces applied to said plurality of lift pins.

6. The system of claim 1, wherein the plurality of force sensing elements are selected from the list consisting of wire mesh strain gauges, piezoelectric strain gauges, semiconductor strain gauges, force sensitive resistors, and optical displacement sensors.

7. The system of claim 6, wherein the strain gauges comprise piezoelectric strain gauges.

8. A method for sensing forces applied to a substrate lifting apparatus, comprising:
   at a controller, receiving signals from a plurality of force sensing elements disposed on a plurality of lifting arms associated with a plurality of lift pins, the received signals representative of a deflection of a respective lifting arm of the plurality of lift pins;
   the received signals representative of a force applied to a lift pin of a substrate lifting apparatus; and
   controlling operation of said substrate lifting apparatus based on said received signals.

9. The method of claim 8, further comprising, at the controller, comparing said received signals with a predetermined value or range to determine whether force applied to said lift pin is within an acceptable range.

10. The method of claim 8, wherein the force sensing element comprises a plurality of force sensing elements, and the lift pin comprises a plurality of lift pins, the method further comprising, at the controller, receiving signals from the plurality of said force sensing elements and controlling operation of said substrate lifting apparatus based on said received signals.

11. The method of claim 8, wherein controlling operation of said substrate lifting apparatus comprises stopping movement of said substrate lifting apparatus based on said received signals.

12. The method of claim 8, further comprising storing data representative of said received signals in memory associated with said controller.

13. A method of operating a substrate lifting apparatus, comprising:
   at a controller, sampling signals from a force sensing element associated with a lift pin of a substrate lifting apparatus, the substrate lifting apparatus comprising a central hub, a lifting arm, and the lift pin, the force sensing element disposed on the lifting arm, said sampling occurring prior to moving said lift pin, wherein said sample signals are representative of a sensed deflection of the lifting arm;
   correlating said sensed deflection into a force applied to said lift pin; and
   controlling movement of said lift pin based on said sampled signals.

14. The method of claim 13, further comprising moving the lift pin from an extended position in which the lift pin is disposed above the top surface of the platen, to a retracted position in which the lift pin is disposed below a top surface of a platen.

15. The method of claim 13, comprising, at an implanter control computer, receiving a signal from the controller and, based on the received signal, coordinating operation of an implanter subsystem with the movement of said lift pin.

16. The method of claim 13, wherein said moving said lift pin comprises moving the lift pin from a retracted position, in which the lift pin is disposed below a top surface of a platen, to an extended position in which the lift pin is disposed above the top surface of the platen.

17. The method of claim 16, further comprising:
   contacting the lift pin with a substrate when said lift pin is in the extended position, and sampling signals from said force sensing element when said lift pin is in contact with said substrate.

18. The method of claim 17, further comprising, at said controller, determining whether said sampled signals are representative of a force associated with a condition in which the substrate is stuck to the platen.

19. The method of claim 17, further comprising, at said controller, determining whether said sampled signals are representative of a force associated with a broken substrate.

20. The method of claim 17, further comprising, at said controller, determining whether said sampled signals are representative of a force associated with a mis-positioned substrate.

* * * * *